(12) United States Patent
Ok

(10) Patent No.: US 10,170,176 B2
(45) Date of Patent: Jan. 1, 2019

(54) APPARATUS AND METHODS FOR GENERATING REFERENCE VOLTAGES FOR INPUT BUFFERS OF A MEMORY DEVICE

(71) Applicant: SK hynix Inc., Gyeonggi-do (KR)

(72) Inventor: Sung Hwa Ok, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 34 days.

(21) Appl. No.: 15/614,677

(22) Filed: Jun. 6, 2017

(65) Prior Publication Data
US 2018/0130517 A1    May 10, 2018

(30) Foreign Application Priority Data

Nov. 9, 2016  (KR) .................. 10-2016-0148988

(51) Int. Cl.

| | |
|---|---|
| *G11C 11/408* | (2006.01) |
| *G11C 11/4099* | (2006.01) |
| *G11C 11/4074* | (2006.01) |
| *G11C 11/4093* | (2006.01) |
| *G11C 7/10* | (2006.01) |
| *G11C 16/30* | (2006.01) |
| *G11C 14/00* | (2006.01) |
| *G11C 5/14* | (2006.01) |
| *G11C 16/04* | (2006.01) |
| *G11C 16/10* | (2006.01) |

(52) U.S. Cl.
CPC ........ *G11C 11/4099* (2013.01); *G11C 7/1084* (2013.01); *G11C 11/4074* (2013.01); *G11C 11/4082* (2013.01); *G11C 11/4093* (2013.01); *G11C 16/30* (2013.01); *G11C 5/147* (2013.01); *G11C 14/00* (2013.01); *G11C 16/0483* (2013.01); *G11C 16/10* (2013.01)

(58) Field of Classification Search
CPC ................................................. G11C 11/4099
See application file for complete search history.

(56) References Cited

U.S. PATENT DOCUMENTS

| 8,843,696 B2* | 9/2014 | Hasegawa ............... G06F 13/16 |
| | | 711/100 |
| 8,966,208 B2* | 2/2015 | Gillingham ........... G06F 1/3203 |
| | | 711/105 |
| 9,190,121 B2* | 11/2015 | Kim ....................... G11C 5/147 |

(Continued)

FOREIGN PATENT DOCUMENTS

| KR | 1020070074991 | 7/2007 |
| KR | 1020140023749 | 2/2014 |

*Primary Examiner* — Anthan Tran
*Assistant Examiner* — Mushfique Siddique
(74) *Attorney, Agent, or Firm* — IP & T Group LLP

(57) ABSTRACT

Various embodiments of the invention relate generally to an electronic device, and more particularly, to a semiconductor memory device and an operating method thereof. A semiconductor memory device including a plurality of memory cells using an optimal input buffer reference voltage may include at least one input buffer receiving data to be stored in the plurality of memory cells, and an input buffer reference voltage control unit setting one of a plurality of internal voltages generated beforehand and having different voltage levels as a reference voltage of the at least one input buffer in response to a control signal received from a controller controlling the semiconductor memory device.

13 Claims, 10 Drawing Sheets

(56) References Cited

U.S. PATENT DOCUMENTS

| | | | |
|---|---|---|---|
| 9,396,777 B1* | 7/2016 | Lee | G11C 5/02 |
| 9,442,670 B2* | 9/2016 | Kruger | G06F 3/0634 |
| 9,711,197 B1* | 7/2017 | Kim | G11C 7/22 |
| 9,727,454 B2* | 8/2017 | Kuzmin | G06F 12/0246 |
| 10,020,070 B2* | 7/2018 | Choi | G11C 29/52 |
| 2002/0024330 A1* | 2/2002 | Hosogane | G06F 1/22 |
| | | | 323/317 |
| 2004/0017690 A1* | 1/2004 | Lee | G11C 5/147 |
| | | | 365/145 |
| 2004/0128601 A1* | 7/2004 | Muljono | G01R 31/31716 |
| | | | 714/734 |
| 2004/0170067 A1* | 9/2004 | Kashiwazaki | G11C 5/14 |
| | | | 365/189.09 |
| 2006/0104144 A1* | 5/2006 | Byeon | G11C 5/14 |
| | | | 365/226 |
| 2006/0158161 A1* | 7/2006 | Kang | G11C 5/14 |
| | | | 323/234 |
| 2006/0212693 A1* | 9/2006 | Cho | G06F 9/4403 |
| | | | 713/1 |
| 2007/0153590 A1* | 7/2007 | Seo | G11C 5/147 |
| | | | 365/189.09 |
| 2007/0205926 A1* | 9/2007 | Kobayashi | H04L 25/062 |
| | | | 341/51 |
| 2008/0002505 A1* | 1/2008 | Park | G11C 5/143 |
| | | | 365/226 |
| 2008/0219077 A1* | 9/2008 | Choi | G11C 5/147 |
| | | | 365/226 |
| 2009/0003089 A1* | 1/2009 | Do | G11C 5/066 |
| | | | 365/189.09 |
| 2009/0010078 A1* | 1/2009 | Do | G11C 5/147 |
| | | | 365/189.09 |
| 2009/0045796 A1* | 2/2009 | Kang | G05F 1/575 |
| | | | 323/318 |
| 2009/0122634 A1* | 5/2009 | Kang | G11C 5/147 |
| | | | 365/226 |
| 2010/0118639 A1* | 5/2010 | Kang | G11C 7/1078 |
| | | | 365/230.08 |
| 2010/0226185 A1* | 9/2010 | Lee | G11C 5/04 |
| | | | 365/189.05 |
| 2011/0095814 A1* | 4/2011 | Kim | G11C 5/14 |
| | | | 327/538 |
| 2012/0081100 A1* | 4/2012 | Lee | G11C 5/147 |
| | | | 323/314 |
| 2012/0213003 A1* | 8/2012 | Yun | G11C 11/5642 |
| | | | 365/185.09 |
| 2013/0162342 A1* | 6/2013 | Song | G11C 5/147 |
| | | | 327/543 |
| 2013/0223175 A1* | 8/2013 | Lee | G05F 1/56 |
| | | | 365/228 |
| 2014/0153344 A1* | 6/2014 | Kim | G11C 5/147 |
| | | | 365/189.09 |
| 2014/0300392 A1* | 10/2014 | Do | G11C 5/147 |
| | | | 327/108 |
| 2015/0063047 A1* | 3/2015 | Choi | G11C 5/148 |
| | | | 365/203 |
| 2017/0365325 A1* | 12/2017 | Murakami | G11C 16/0483 |
| 2018/0082748 A1* | 3/2018 | Kim | G11C 16/10 |
| 2018/0090224 A1* | 3/2018 | Choi | G11C 29/1201 |

* cited by examiner

APPARATUS AND METHODS FOR GENERATING REFERENCE VOLTAGES FOR INPUT BUFFERS OF A MEMORY DEVICE

CROSS-REFERENCE TO RELATED APPLICATION

The present application claims priority under 35 U.S.C. § 119(a) to Korean patent application number 10-2016-0148988, filed on Nov. 9, 2016, the entire disclosure of which is incorporated herein by reference in its entirety.

BACKGROUND

Field of Invention

Various embodiments of the invention relate generally to an electronic device, and more particularly, to a semiconductor memory device and an operating method thereof.

Description of Related Art

A semiconductor memory device is a memory device embodied by using semiconductors such as silicon (Si), germanium (Ge), gallium arsenide (GaAs), and indium phosphide (InP). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are typically classified into NOR-type memories and NAND-type memories.

SUMMARY

Various embodiments are directed to a semiconductor memory device using an optimal reference voltage for an input buffer, and an operating method thereof.

According to an embodiment, a semiconductor memory device including a plurality of memory cells may include at least one input buffer receiving data to be stored in the plurality of memory cells and an input buffer reference voltage control unit setting one of a plurality of internal voltages having different voltage levels as a reference voltage of the at least one input buffer in response to a control signal.

According to an embodiment, a method of operating a semiconductor memory device including at least one input buffer receiving data from an external device may include receiving a control signal for setting a reference voltage of the at least one input buffer and setting one of a plurality of internal voltages having different voltage levels as the reference voltage in response to the control signal.

According to an embodiment, a memory system may include a plurality of semiconductor memory devices each including at least one input buffer receiving data from an external device and a controller providing the plurality of semiconductor memory devices with control signals for setting an optimal reference voltage of the at least one input buffer corresponding to each of the plurality of semiconductor memory devices.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
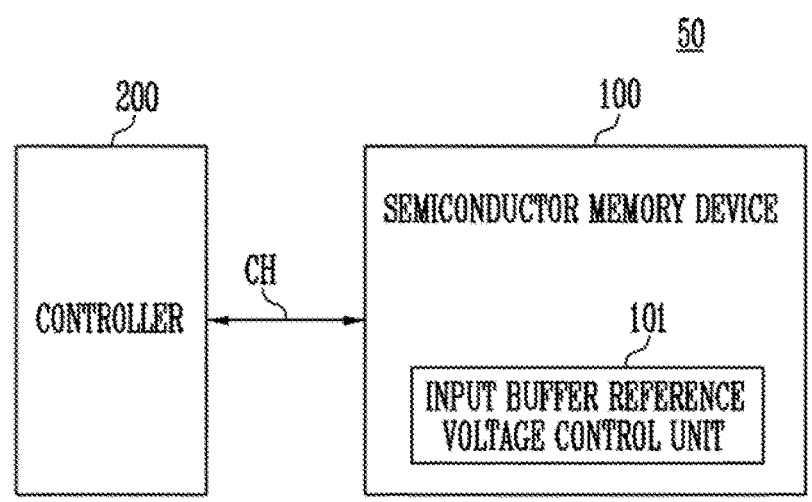
FIG. 1 is a block diagram illustrating a semiconductor memory system according to an embodiment.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the examples of embodiments according to the concepts are not limited to the specific embodiments, but include all changes, equivalents, or alternatives which are included in the spirit and technical scope of the present disclosure.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

In some embodiments, well-known processes, device structures, and technologies will not be described in detail to avoid ambiguousness of the present invention.

Hereinafter, the present disclosure will be described by explaining examples of embodiments with reference to the accompanying drawings.

FIG. 1 is a block diagram illustrating a memory system 50 according to an embodiment.

Referring to FIG. 1, the memory system 50 may include a semiconductor memory device 100 and a controller 200.

The semiconductor memory device 100 may be a non-volatile memory device. The semiconductor memory device 100 may be a volatile memory device. More particularly, in some embodiments, the semiconductor memory device 100 may be a NAND flash memory, a vertical NAND, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM). The invention is applicable to a flash memory device in which a charge storage layer includes a conductive floating gate (FG) and a charge trap flash (CTF) memory device in which a charge storage layer includes an insulating layer. In some embodiments, the semiconductor memory device 100 may have a three-dimensional array structure.

The semiconductor memory device 100 may operate in response to control of the controller 200. The semiconductor memory device 100 may include a memory cell array having a plurality of memory cells for storing data. The memory cells may be organized in any suitable manner. In an embodiment, the memory cells may be grouped in pages, and the pages may be grouped in memory blocks. The memory cells may be single level cells (SLCs) or multiple level cells (MLCs). According to an embodiment, the semiconductor memory device 100 may be a flash memory device.

In operation, the semiconductor memory device 100 may receive a command and an address through a channel CH from the controller 200, may then select and access an area in the memory cell array based on the received address, and may perform an internal operation corresponding to the command on the selected area of the memory cell array.

For example, the semiconductor memory device 100 may perform a program operation, a read operation and an erase operation in response to a respective program, read operation and erase command received form the controller 200. During a program operation, the semiconductor memory device 100 may program a selected area of the memory cell array with received write data. During a read operation, the semiconductor memory device 100 may read data from a selected area of the memory cell array. During an erase operation, the semiconductor memory device 100 may erase the data stored in a selected area of the memory cell array. In each of the program, read and erase operations the selected area is selected based on an address received from the controller 200.

The semiconductor memory device 100 may include an input buffer reference voltage control unit 101.

The semiconductor memory device 100 may include input buffers receiving data from the controller 200. According to an embodiment, the input buffers of the semiconductor memory device 100 may be differential input buffers driven by the differences between a reference voltage and the input data. The reference voltage may be differently optimal to respective semiconductor memory devices 100.

According to an embodiment, the controller 200 may set the reference voltage for the input buffer included in the semiconductor memory device 100. More specifically, the controller 200 may provide the semiconductor memory device 100 through the channel CH with a control signal to set the reference voltage of the input buffer. The input buffer reference voltage control unit 101 included in the semiconductor memory device 100 may set the reference voltage of the input buffer in response to the control signal. The control signal may be a combination of a command, an address and data for the controller 200 to control the semiconductor memory device 100. For example, the controller 200 may provide the semiconductor memory device 100 with a reference voltage setting command (command), a reference voltage setting address (address) and a reference voltage generation code (data) as the control signal. According to an embodiment, the reference voltage setting command may correspond to a set feature operation. In addition, the reference voltage setting address may be a feature address for setting the reference voltage according to the set feature operation.

When receiving the reference voltage setting command, the input buffer reference voltage control unit 101 may generate a selection signal according to the received reference voltage generation code. More specifically, the input buffer reference voltage control unit 101 may generate the selection signal by decoding the input reference voltage generation code. The input buffer reference voltage control unit 101 may determine an internal voltage corresponding to the selection signal among a plurality of internal voltages having different voltage levels. The input buffer reference voltage control unit 101 may provide the determined internal voltage to the input buffers as the reference voltage of the input buffer (hereinafter, referred to as an input buffer reference voltage).

According to an embodiment, when the controller 200 controls two or more semiconductor memory devices 100, input buffer reference voltages may be set differently for the respective semiconductor memory devices 100. The controller 200 may transfer a control signal to each of the two or more semiconductor memory devices 100 through the channel. The input buffer reference voltage control unit 101 included in each of the semiconductor memory devices 100 may determine an optimal input buffer reference voltage for each of the semiconductor memory devices 100 on the basis of the received control signal. Each control signal may be a combination of a command, an address and data for the controller 200 to control a semiconductor memory device 100 among the two or more semiconductor memory devices 100.

The input buffer reference voltages of the respective semiconductor memory devices 100 may have different voltage levels from each other. In other words, the respective semiconductor memory devices 100 may exhibit optimal operation performances at different voltage levels of the input buffer reference voltages. The controller 200 may transfer a reference voltage setting command, a logical unit number (LUN) address (or die address), a reference voltage setting address (feature address) and a reference voltage generation code (data) as the control signal to each of the semiconductor memory devices 100. According to an embodiment, the reference voltage setting command may correspond to a LUN set feature operation. The LUN address or the die address may be an address for identifying each semiconductor memory device 100. The reference voltage setting address may be a feature address for setting the input buffer reference voltage according to the LUN set feature operation.

When receiving the reference voltage setting command, the input buffer reference voltage control unit 101 included in each semiconductor memory device 100 may generate a selection signal according to the received reference voltage generation code. More specifically, the input buffer reference voltage control unit 101 may generate the selection signal by decoding the reference voltage generation code. The input buffer reference voltage control unit 101 may determine an internal voltage corresponding to the selection signal among a plurality of internal voltages having different voltage levels. The input buffer reference voltage control unit 101 may provide the determined internal voltage to the input buffers as the input buffer reference voltage.

According to various embodiments, the input buffer reference voltage may vary depending on a semiconductor memory device, a die, a plane, or a memory block. For example, according to an embodiment, when the input buffer reference voltage varies depending on each semiconductor memory device, each die, each plane, or each memory block according to a process, voltage, temperature (PVT) variation, a controller may measure an optimal input buffer reference voltage of each input buffer according to each semiconductor memory device, each die, each plane, or each memory block. The controller may provide a semiconductor memory device with a reference voltage setting command (command), a reference voltage setting address (address) and a reference voltage generation code (data) corresponding to the measured optimal reference voltage.

According to an embodiment, an input buffer reference voltage setting operation of the semiconductor memory device 100 may be performed after power is supplied to the semiconductor memory device 100. For example, when the semiconductor memory device 100 is powered up, the controller 200 may perform an initial calibration operation to determine an optimal operating voltage of the semiconductor memory device 100, so that an optimal input buffer reference voltage at which the input buffer of the semiconductor memory device 100 operates may be determined. The controller 200 may include a reference voltage generation code (data) corresponding to the optimal input buffer reference voltage determined by the initial calibration operation in the control signal and transfer the control signal to the semiconductor memory device 100.

According to an embodiment, a voltage level of the input buffer reference voltage to operate optimally may be changed according to lifetime, manufacturing processes, an operating voltage, changes in operating temperature, or other various factors of the semiconductor memory device 100. The controller 200 may transfer again the control signal to set the input buffer reference voltage thereby changing the voltage level of the input buffer reference voltage.

The controller 200 may control the semiconductor memory device 100 to perform a program operation, a read operation or an erase operation in addition to the input buffer reference voltage setting operation. During a program operation, the controller 200 may provide a program command, an address and data to the semiconductor memory device 100 through the channel CH. During a read operation, the controller 200 may provide a read command and an address to the semiconductor memory device 100 through the channel CH. During an erase operation, the controller 200 may provide an erase command and an address to the semiconductor memory device 100 through the channel CH.

Though not shown in FIG. 1, according to an embodiment, the controller 200 may include components such as a random access memory (RAM), a processing unit, a host interface and a memory interface.

The RAM may serve as at least one of an operation memory of the processing unit, a cache memory between the semiconductor memory device 100 and a host, and a buffer memory between the semiconductor memory device 100 and the host.

The processing unit may control the general operation of the controller 200. The processing unit may be configured to control a read operation, a program operation, an erase operation and background operations of the semiconductor memory device 100. The processing unit may be configured to operate firmware to control the semiconductor memory device 100. According to an embodiment, the processing unit may function as a flash translation layer FTL. The processing unit may translate a logical block address LBA provided by the host into a physical block address PBA through the flash translation layer FTL. The flash translation layer FTL may receive the logical block address LBA and translate the logical block address LBA into the physical block address PBA by using a mapping table. Various address mapping methods may be employed. The address mapping method may for example vary according to a mapping unit employed in the flash translation layer FTL. Examples of various address mapping methods may include a page mapping method, a block mapping method, and a hybrid mapping method.

The processing unit may be configured to randomize data received from the host. For example, the processing unit may randomize the data received from the host by using a randomizing seed. The randomized data may be provided to the semiconductor memory device, so that the memory cell array may be programmed with the randomized data.

The processing unit may be configured to derandomize data from the semiconductor memory device 100 during a read operation. For example, the processing unit may derandomize the data received from the semiconductor memory device 100 by using a derandomizing seed. The derandomized data may be output to the host. According to an embodiment, the processing unit may perform randomizing and derandomizing operations by driving software and/or firmware.

The host interface may include a protocol for data exchange between the host and the controller 200. According to an embodiment, the controller 200 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface may interface with the semiconductor memory device 100. For example, the memory interface may include a NAND interface or a NOR interface.

Figure 2:
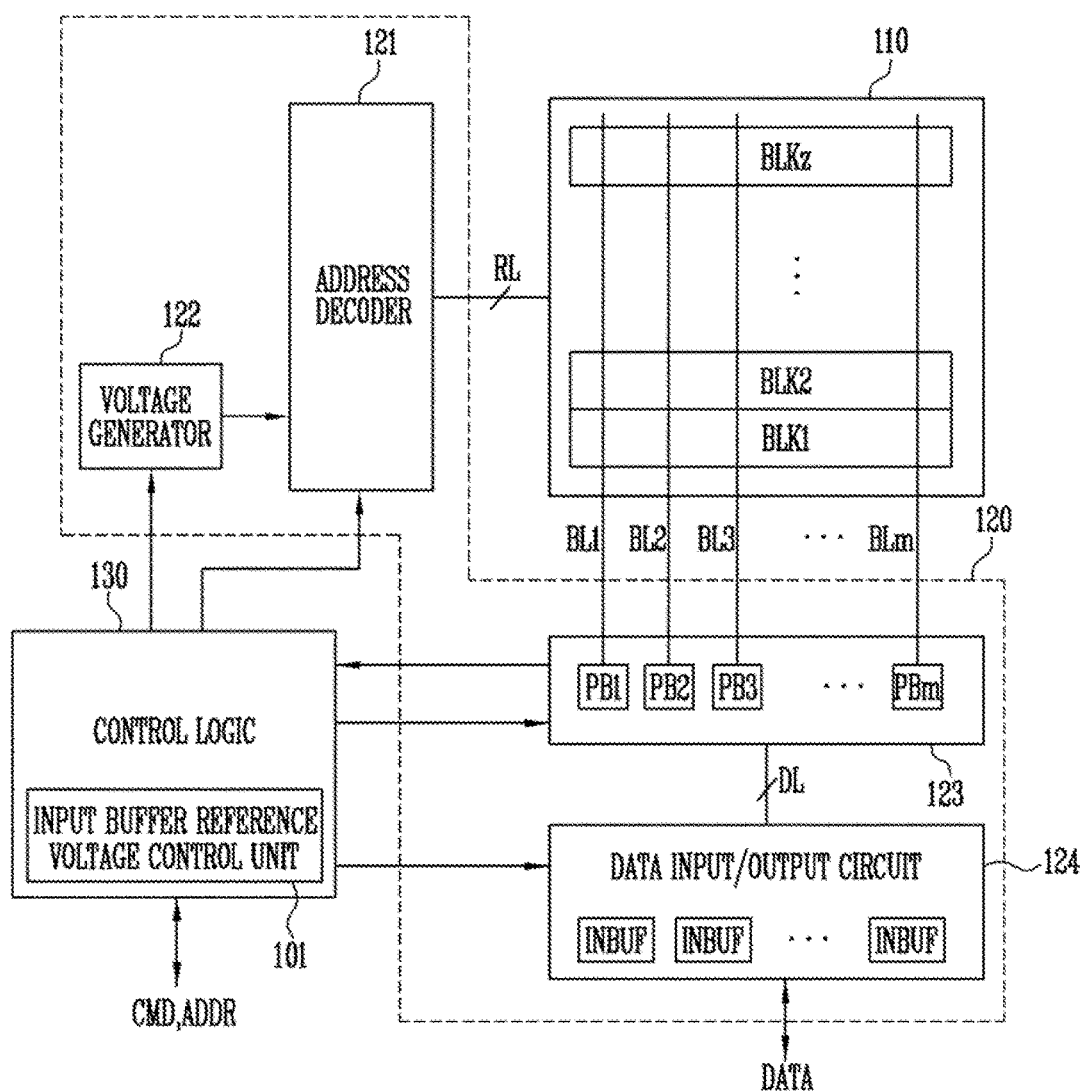
FIG. 2 is a block diagram illustrating an exemplary configuration of a semiconductor memory device employed in the semiconductor memory system of FIG. 1.

FIG. 2 is a block diagram illustrating an exemplary configuration of the semiconductor memory device 100 shown in FIG. 1.

Figure 3:
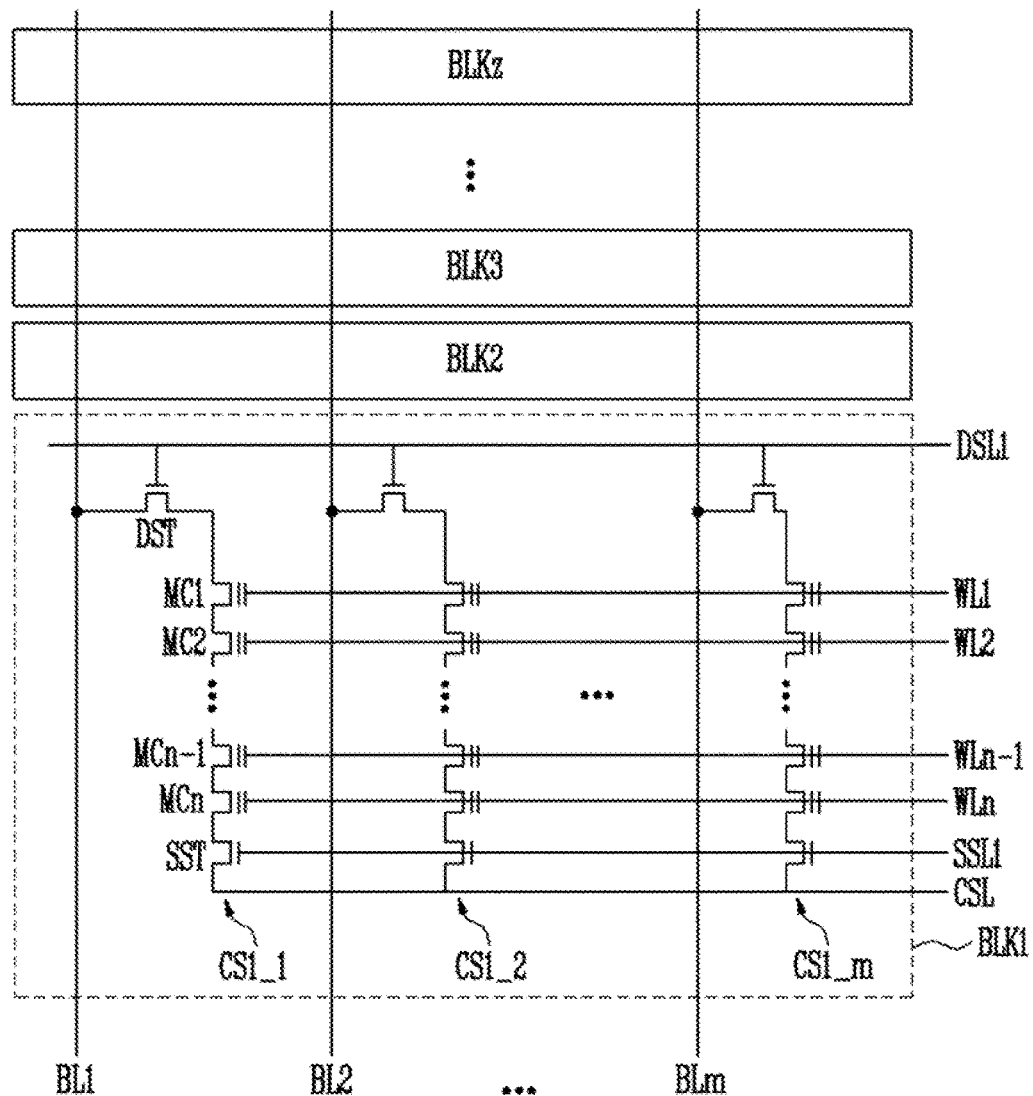
FIG. 3 is a diagram illustrating an exemplary configuration of a memory cell array of the semiconductor memory device of FIG. 2.

FIG. 3 is a diagram illustrating an embodiment of the memory cell array shown in FIG. 2.

Referring to FIG. 2, the semiconductor memory device 100 may include a memory cell array 110, a peripheral circuit 120 and a control logic 130.

The memory cell array 110 may include a plurality of memory blocks BLK1 to BLKz. The memory blocks BLK1 to BLKz may be coupled to an address decoder 121 through row lines RL. The memory blocks BLK1 to BLKz may be coupled to a read and write circuit 123 through bit lines BL1 to BLm. Each of the memory blocks BLK1 to BLKz may include a plurality of memory cells. According to an embodiment, a plurality of memory cells may be non-volatile memory cells. Memory cells coupled to the same word line, among the plurality of memory cells, may be defined as a single page. In other words, each memory block of the memory cell array 110 may include a plurality of pages.

The memory cells of the semiconductor memory device 100 may include a single level cell (SLC) storing a single data bit, or a multi-level cell (MLC) storing two or more data bits, such as a triple level cell (TLC) storing three data bits, or a quad level cell (QLC) storing four data bits. Often times a two-bit level cell is referred to simply as an MLC.

A memory cell array 110_1 as shown in FIG. 3 is an exemplary configuration of the memory cell array 110 shown in FIG. 2.

Referring to FIG. 3, the first to zth memory blocks BLK1 to BLKz included in the memory cell array 110_1 may be commonly coupled to the first to mth bit lines BL1 to BLm. For convenience of explanation, in FIG. 3, elements included in the first memory block BLK1, among the memory blocks BLK1 to BLKz, are shown, while elements included in the memory blocks BLK2 to BLKz are omitted. However, it will be understood that each of the memory blocks BLK2 to BLKz has substantially the same configuration as the first memory block BLK1.

The first memory block BLK1 may include a plurality of cell strings CS1_1 to CS1_m. The first to mth cell strings CS1_1 to CS1_m may be coupled to the first to mth bit lines BL1 to BLm, respectively.

Each of the first to mth cell strings CS1_1 to CS1_m may include a drain selection transistor DST, a plurality of memory cells MC1 to MCn coupled in series, and a source selection transistor SST. The drain selection transistor DST may be coupled to a drain selection line DSL1. Each of the first to nth memory cells MC1 to MCn may be coupled to each of the first to nth word lines WL1 to WLn. The source selection transistor SST may be coupled to a source selection line SSL1. A drain side of the drain selection transistor DST may be coupled to the corresponding bit line. Drain selection transistors of the first to mth cell strings CS1_1 to CS1_m may be coupled to the first to mth bit lines BL1 to BLm, respectively. A source side of the source selection transistor SST may be coupled to a common source line CSL. According to an embodiment, the common source line CSL may be commonly coupled to the first to zth memory blocks BLK1 to BLKz.

The drain selection line DSL1, the first to nth word lines WL1 to WLn, and the source selection line SSL1 may be included in the row lines RL shown in FIG. 2. The drain selection line DSL1, the first to nth word lines WL1 to WLn, and the source selection line SSL1 may be controlled by the address decoder 121. The common source line CSL may be controlled by the control logic 130. The first to mth bit lines BL1 to BLm may be controlled by the read and write circuit 123.

Referring again to FIG. 2, the peripheral circuit 120 may include the address decoder 121, a voltage generator 122, the read and write circuit 123 and a data input/output circuit 124.

The peripheral circuit 120 may drive the memory cell array 110. For example, the peripheral circuit 120 may drive the memory cell array 110 to perform a program operation, a read operation and an erase operation.

The address decoder 121 may be coupled to the memory cell array 110 through the row lines RL. The address decoder 121 may be configured to operate in response to control of the control logic 130. The address decoder 121 may receive an address ADDR from the control logic 130 through input/output buffers in the semiconductor memory device 100.

The address decoder 121 may be configured to decode a block address in the received address ADDR. The address decoder 121 may select at least one of the memory blocks BLK1 to BLKz according to the decoded block address. The address decoder 121 may be configured to decode a row address in the received address ADDR. The address decoder 121 may apply voltages provided from the voltage generator 122 according to the decoded row address to at least one word line WL so as to select at least one word line of a selected memory block.

During a program operation, the address decoder 121 may apply a program voltage to a selected word line and a pass voltage having a lower voltage level than the program voltage to unselected word lines. During a program verify operation, the address decoder 121 may apply a verify voltage to the selected word line and a verify pass voltage greater than the verify voltage to the unselected word lines.

During a read operation, the address decoder 121 may apply a read voltage to the selected word line and a pass voltage greater than the read voltage to the unselected word lines.

According to an embodiment, an erase operation of the semiconductor memory device 100 may be performed on each memory block. The address ADDR input to the semiconductor memory device 100 during the erase operation may include a block address. The address decoder 121 may decode the block address and select one memory block according to the decoded block address. During the erase operation, the address decoder 121 may apply a ground voltage to a word line input to the selected memory block.

According to an embodiment, the address decoder 121 may be configured to decode a column address in the transferred address ADDR. The decoded column address DCA may be transferred to the read and write circuit 123. For example, the address decoder 121 may include components such as a row decoder, a column decoder, and an address buffer.

The voltage generator 122 may be configured to generate a plurality of voltages by using an external power voltage supplied to the semiconductor memory device 100. The voltage generator 122 may operate in response to control of the control logic 130.

According to an embodiment, the voltage generator 122 may generate an internal power voltage by regulating an external power voltage. The internal power voltage generated by the voltage generator 122 may serve as the operating voltage of the semiconductor memory device 100.

According to an embodiment, the voltage generator 122 may generate a plurality of voltages by using the external power voltage or the internal power voltage. The voltage generator 122 may be configured to generate various voltages for the semiconductor memory device 100. For example, the voltage generator 122 may generate a plurality of program voltages, a plurality of pass voltages, a plurality of selected read voltages, and a plurality of unselected read voltages.

For example, the voltage generator 122 may include a plurality of pumping capacitors receiving the internal power voltage. The voltage generator 122 may generate a plurality of voltages by selectively activating the plurality of pumping capacitors in response to control of the control logic 130.

The address decoder 121 may provide the generated voltages to the memory cell array 110.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to control of the control logic 130.

The first to mth page buffers PB1 to PBm may communicate data with the data input/output circuit 124. During a program, the first to mth page buffers PB1 to PBm may receive data DATA to be stored through the data input/output circuit 124 and data lines DL.

During a program operation, when a program pulse is applied to a selected word line, the first to mth page buffers PB1 to PBm may transfer the received data DATA to be stored through the data input/output circuit 124 to selected memory cells through the bit lines BL1 to BLm, respectively. The selected memory cells of the selected page may be programmed with the transferred data DATA. A memory cell coupled to a bit line to which a program permission voltage (e.g., a ground voltage) is applied may have an increased threshold voltage. On the other hand, a threshold voltage of a memory cell coupled to a bit line to which a program inhibition voltage (e.g., a power voltage) is applied may be maintained. During a program verify operation, the first to mth page buffers PB1 to PBm may read page data from the selected memory cells through the bit lines BL1 to BLm, respectively.

During a read operation, the read and write circuit 123 may read the data DATA from the memory cells of the selected page through the bit lines BL and output the read data DATA to the data input/output circuit 124.

During an erase operation, the read and write circuit 123 may float the bit lines BL. According to an embodiment, the read and write circuit 123 may include a column selection circuit.

The data input/output circuit 124 may be coupled to the first to mth page buffers PB1 to PBm through the data lines DL. The data input/output circuit 124 may operate in response to control of the control logic 130.

The data input/output circuit 124 may include a plurality of input buffers INBUF receiving data being inputted. The data input/output circuit 124 may include a plurality of output buffers (not illustrated) outputting data.

During a program, the data input/output circuit 124 may receive the data DATA to be stored from an external controller (not illustrated) through the plurality of input buffers INBUF. During a read operation, the data input/output circuit 124 may output the data from the first to mth page buffers PB1 to PBm included in the read and write circuit 123 to the external controller.

According to an embodiment, the input buffers INBUF may be differential input buffers that are driven by the differences between the input buffer reference voltage and the data being input. Different optimal input buffer reference voltages may be determined for each of the respective semiconductor memory devices 100.

The control logic 130 may be coupled to the address decoder 121, the voltage generator 122, the read and write circuit 123 and the data input/output circuit 124. The control logic 130 may be configured to control the general operation of the semiconductor memory device 100. The control logic 130 may operate in response to a command CMD transferred from an external device.

The control logic 130 may further include the input buffer reference voltage control unit 101. The input buffer reference voltage control unit 101 may set the input buffer reference voltage in response to the control signal input from the controller 200. The semiconductor memory device 100 may receive the data from the controller 200 through the input buffer by using the set input buffer reference voltage.

The control signal provided from the controller 200 may be a combination of a command, an address and data. For example, the controller 200 may provide the input buffer reference voltage control unit 101 with a reference voltage setting command (command), a reference voltage setting address (address) and a reference voltage generation code (data) as the control signal. According to an embodiment, the reference voltage setting command may correspond to a set feature operation. In addition, the reference voltage setting address may be a feature address for setting the reference voltage according to the set feature operation.

When receiving the reference voltage setting command, the input buffer reference voltage control unit 101 may generate a selection signal according to the input reference voltage generation code. More specifically, the input buffer reference voltage control unit 101 may decode the input reference voltage generation code to generate the selection signal. The input buffer reference voltage control unit 101 may determine an internal voltage corresponding to the selection signal among a plurality of internal voltages having different voltage levels. The input buffer reference voltage control unit 101 may provide the determined internal voltage to the input buffers as the input buffer reference voltage.

According to an embodiment, the controller 200 may transfer a reference voltage setting command (command), a LUN address (or die address), a reference voltage setting address (feature address) and a reference voltage generation code (data) as the control signal to set an input buffer reference voltage of each of two or more semiconductor memory devices 100. According to an embodiment, the reference voltage setting command may correspond to a LUN set feature operation. The LUN address or the die address may be an address for identifying each semiconductor memory device 100. The reference voltage setting address may be a feature address for setting the input buffer reference voltage according to the LUN set feature operation.

According to an embodiment, an input buffer reference voltage setting operation of the semiconductor memory device 100 may be performed after power is supplied to the semiconductor memory device 100. For example, when the semiconductor memory device 100 is powered up, the 200 controller may perform an initial calibration operation to determine an optimal input buffer reference voltage of the semiconductor memory device 100. As a result, an optimal input buffer reference voltage at which the input buffer of the semiconductor memory device 100 operates may be determined. The external controller may include a reference voltage generation code (data) corresponding to the optimal input buffer reference voltage determined by the initial calibration operation in the control signal and transfer the control signal to the input buffer reference voltage control unit 101.

According to an embodiment, a voltage level of the input buffer reference voltage at which the input buffer operates optimally may be changed according to lifetime, manufacturing processes, an operating voltage, changes in operating temperature, or other various factors of the semiconductor memory device 100. The controller 200 may change the voltage level of the input buffer reference voltage by transferring again the control signal to set the input buffer reference voltage.

According to an embodiment, the input buffer reference voltage may vary depending on each semiconductor memory device, each die, each plane, or each memory block. For example, according to an embodiment, when different input buffer reference voltages are set according to each semiconductor memory device, each die, each plane, or each memory block in response to a process, voltage, and temperature (PVT) variation, the controller may measure an optimal input buffer reference voltage according to each semiconductor memory device, each die, or each memory block.

The controller 200 may provide the semiconductor memory device 100 with a reference voltage generation code corresponding to the measured optimal input buffer reference voltage according to each semiconductor memory device, each plane, or each memory block. According to an embodiment, the input buffer reference voltage control unit 101 may store in a separate register the reference voltage generation code corresponding to the measured optimal input buffer reference voltage for each semiconductor memory device, each plane, or each memory block. The input buffer reference voltage control unit 101 may generate a selection signal with respect to each input buffer in response to the reference voltage generation code according to each semiconductor memory device, each plane, or each memory block stored in the register. The input buffer reference voltage control unit 101 may determine an internal voltage corresponding to the selection signal, among a plurality of internal voltages having different voltage levels. The input buffer reference voltage control unit 101 may provide the determined internal voltage to the input buffers as the input buffer reference voltage.

Figure 4:
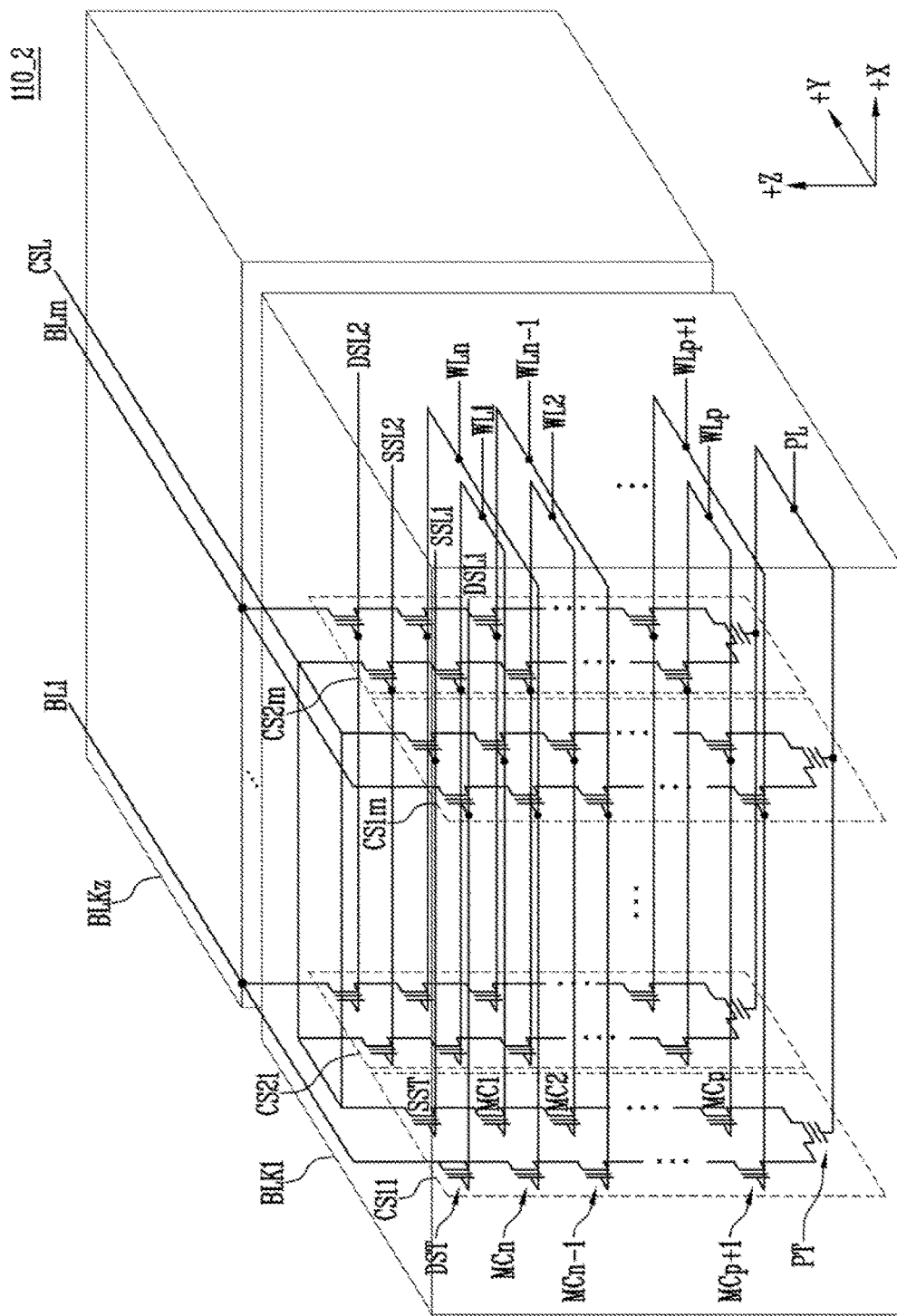
FIG. 4 is a diagram illustrating another exemplary configuration of the memory cell array of the semiconductor memory device of FIG. 2.

FIG. 4 illustrates another exemplary configuration of the memory cell array 110 shown in FIG. 2.

Referring to FIG. 4, a memory cell array 110_2 may include the plurality of memory blocks BLK1 to BLKz. For Illustrative purposes, in FIG. 4, the internal configuration of the first memory block BLK1 is shown and the internal configurations of the remaining memory blocks BLK2 to BLKz are omitted. However, it will be understood that the second to the zth memory blocks BLK2 to BLKz are configured in the same manner as the first memory block BLK1.

Referring to FIG. 4, the first memory block BLK1 may include a plurality of cell strings CS11 to CS1$m$ and CS21 to CS2$m$. According to an embodiment, each of the plurality of cell strings CS11 to CS1$m$ and CS21 to CS2$m$ may have a U shape. In the first memory block BLK1, m cell strings may be arranged in a row direction (i.e., +X direction). For convenience of explanation, FIG. 4 illustrates that two cell strings are arranged in a column direction (i.e., +Y direction). However, three or more cell strings may also be arranged in the column direction.

Each of the plurality of cell strings CS11 to CS1$m$ and CS21 to CS2$m$ may include at least one source selection transistor SST, first to nth memory cells MC1 to MCn, a pipe transistor PT, and at least one drain selection transistor DST.

The selection transistors SST and DST and the memory cells MC1 to MCn may have similar structures to each other. According to an embodiment, each of the selection transistors SST and DST and the memory cells MC1 to MCn may include a channel layer, a tunneling insulating layer, a charge storage layer and a blocking insulating layer. According to an embodiment, a pillar for providing the channel layer may be provided in each cell string. According to an embodiment, a pillar for providing at least of the channel layer, the tunneling insulating layer, the charge storage layer and the blocking insulating layer may be provided in each cell string.

The source selection transistor SST of each cell string may be provided between the common source line CSL and the memory cells MC1 to MCp.

According to an embodiment, source selection transistors of cell strings arranged in the same row may be coupled to a source selection line extending in the row direction, and source selection transistors of cell strings arranged in different rows may be coupled to different source selection lines. FIG. 4 illustrates that source selection transistors of the cell strings CS11 to CS1$m$ in the first row are coupled to the first source selection line SSL1. Source selection transistors of the second row cell strings CS21 to CS2$m$ may be coupled to a second source selection line SSL2.

According to an embodiment, the source selection transistors of the cell strings CS11 to CS1$m$ and CS21 to CS2$m$ may be commonly coupled to one source selection line.

The first to nth memory cells MC1 to MCn of each cell string may be coupled between the source selection transistor SST and the drain selection transistor DST.

The first to nth memory cells MC1 to MCn may be divided into the first to pth memory cells MC1 to MCp and (p+1)th to nth memory cells MCp+1 to MCn. The first to pth memory cells MC1 to MCp may be sequentially arranged in a direction reverse to the +Z direction and be coupled in series between the source selection transistor SST and the pipe transistor PT. The (p+1)th to nth memory cells MCp+1 to MCn may be sequentially arranged in the +Z direction and be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to the first to nth word lines WL1 to WLn, respectively.

According to an embodiment, at least one of the first to nth memory cells MC1 to MCn may serve as a dummy memory cell. When the dummy memory cell is provided, a voltage or current of the corresponding cell string may be more stably controlled. As a result, reliability of data stored in the first memory block BLK1 may be improved.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in a row direction may be coupled to a drain selection line extending in the row direction. Drain selection transistors of the cell strings CS11 to CS1m in the first row may be coupled to the first drain selection line DSL1. Drain selection transistors of the second row cell strings CS21 to CS2m may be coupled to a second drain selection line DSL2.

Cell strings arranged in a column direction may be coupled to a bit line extending in a column direction. FIG. 4 illustrates that the cell strings CS11 and CS21 in the first column are coupled to the first bit line BL1 and the mth column cell strings CS1m and CS2m are coupled to the mth bit line BLm.

Memory cells coupled to the same word line in cell strings arranged in the row direction may form a single page. For example, memory cells coupled to the first word line WL1 coupled to the cell strings CS11 to CS1m in the first row may form one page and memory cells coupled to the first word line WL1 coupled to the second row cell strings CS21 to CS2m may form another page. Cell strings arranged in a single row direction may be selected by selecting one of the drain selection lines DSL1 and DSL2. One page in the selected cell strings may be selected by selecting one of the word lines WL1 to WLn.

Figure 5:
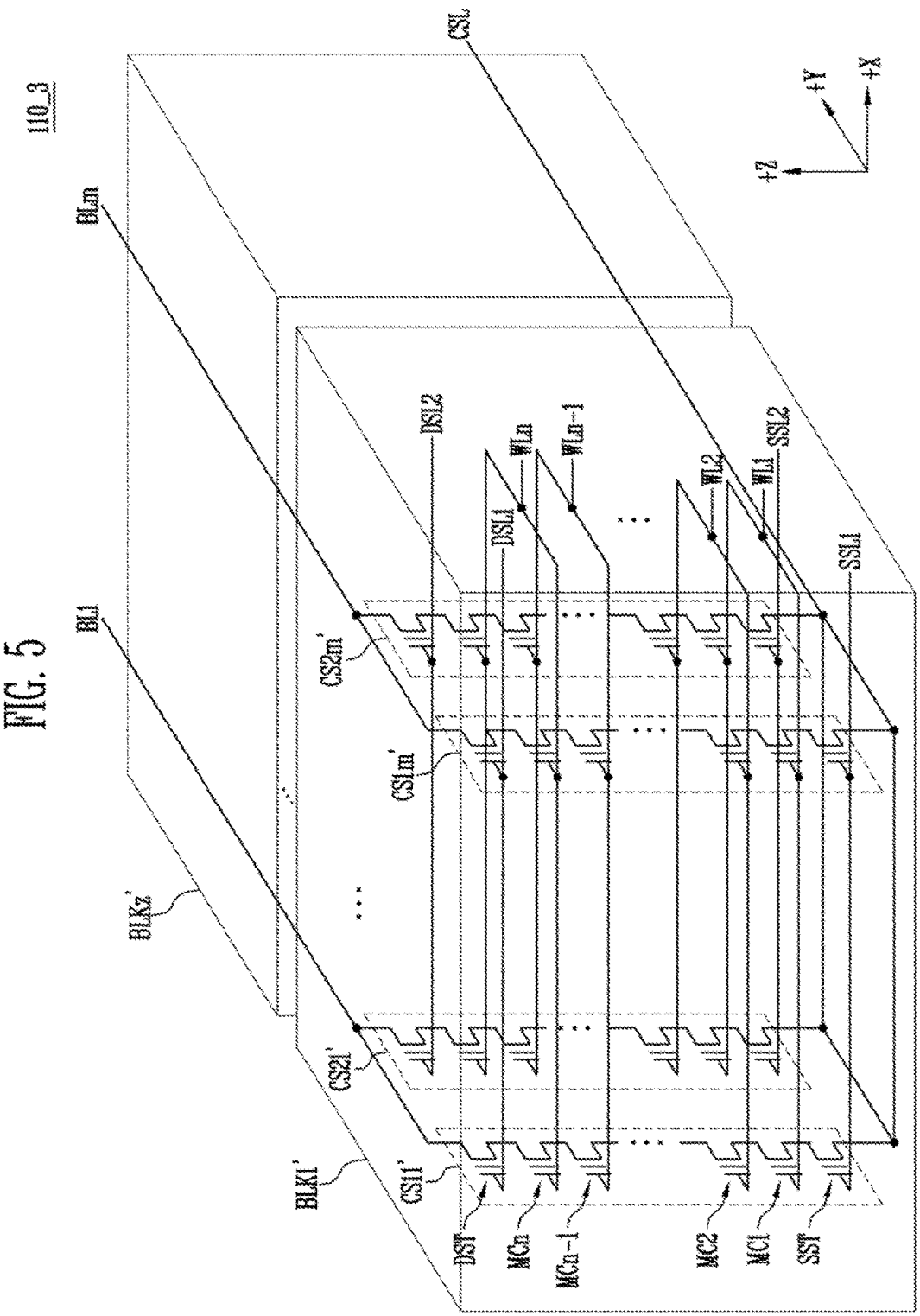
FIG. 5 is a diagram illustrating yet another exemplary configuration of the memory cell array of the semiconductor memory device of FIG. 2.

FIG. 5 shows yet another exemplary configuration of the memory cell array 110 shown in FIG. 2.

Referring to FIG. 5, a memory cell array 110_3 may include a plurality of memory blocks BLK1' to BLKz'. For illustrative purpose, in FIG. 5, the internal configuration of a first memory block BLK1' is shown and the internal configurations of the remaining memory blocks BLK2' to BLKz' are omitted. However, it will be understood that the second to zth memory blocks BLK2' to BLKz' are configured in the same manner as the first memory block BLK1'.

The first memory block BLK1' may include a plurality of cell strings CS11' to CS1m' and CS21' to CS2m'. Each of the cell strings CS11' to CS1m' and CS21' to CS2m' may extend in the +Z direction. M cell strings may be arranged in the +X direction in the first memory block BLK1'. For convenience of explanation, FIG. 5 illustrates two cell strings in +Y direction. However, it will be understood that three or more cell strings may also be arranged in a column direction.

Each of the cell strings CS11' to CS1m' and CS21' to CS2m' may include at least one source selection transistor SST, the first to nth memory cells MC1 to MCn, and at least one drain selection transistor DST.

The source selection transistor SST of each cell string may be coupled between the common source line CSL and the memory cells MC1 to MCn. Source selection transistors of cell strings arranged in the same row may be coupled to the same source selection line. Source selection transistors of the cell strings CS11' to CS1m' arranged in the first row may be coupled to the first source selection line SSL1. Source selection transistors of the cell strings CS21' to CS2m' arranged in the second row may be coupled to the second source selection line SSL2. According to another embodiment, the source selection transistors of the cell strings CS11' to CS1m' and CS21' to CS2m' may be commonly coupled to one source selection line.

The first to nth memory cells MC1 to MCn of each cell string may be coupled in series between the source selection transistor SST and the drain selection transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When a dummy memory cell is provided, a voltage or current of the corresponding cell string may be more stably controlled. As a result, reliability of data stored in the first memory block BLK1' may be improved.

The drain selection transistor DST of each cell string may be coupled between the corresponding bit line and the memory cells MC1 to MCn. Drain selection transistors of cell strings arranged in a row direction may be coupled to a drain selection line extending in the row direction. Drain selection transistors of the first row cell strings CS11' to CS1m' may be coupled to the first drain selection line DSL1. Drain selection transistors of the second row cell strings CS21' to CS2m' may be coupled to the second drain selection line DSL2.

As a result, the memory block BLK1' shown in FIG. 5 may have a similar equivalent circuit to the memory block BLK1 shown in FIG. 4, except that the pipe transistor PT is removed from each cell string.

Figure 6:
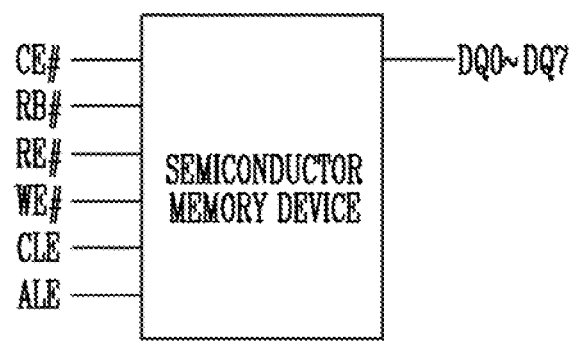
FIG. 6 is a diagram illustrating an exemplary pin configuration of a semiconductor memory device.

FIG. 6 is a diagram illustrating an exemplary pin configuration of a semiconductor memory device.

Referring to FIG. 6, the semiconductor memory device 100 may communicate with an external controller (see controller 200 of FIG. 1) through a plurality of lines.

The semiconductor memory device 100 may communicate with the external controller through a chip enable CE# line, a command latch enable CLE line, an address latch enable ALE line, a write enable WE# line, a read enable RE# line, a ready busy RB# line and data input/output DQ0 to DQ7 lines.

A signal of the chip enable CE# line may indicate that the corresponding semiconductor memory device 100 can be operated. The signal of the chip enable CE# line may be selectively applied to storage devices coupled to the same channel. The signal of the chip enable CE# line may decrease to a low level to show that all operations can be performed in a corresponding chip. When the signal of the chip enable CE# line is at a high level, the corresponding chip may be in a standby state.

A signal of the ready busy RB# line may be at a low level when operations are performed in the chip, so that the chip may be prevented from exchanging another signal with an external device. When the signal of the ready busy RB# is at a high level, it may indicate that the chip is in a ready state.

A command latch enable CLE signal may be at a high level when the command CMD is inputted to a storage device. The address latch enable signal ALE may be at a high level when the address ADD is inputted to the storage device.

A write enable WE# signal may toggle when a command and an address are loaded on the storage device, and a read enable RE# signal may toggle when data is loaded onto the controller.

The data input/output DQ0 to DQ7 lines may input a command, an address and data to the semiconductor memory device 100, or output data from the semiconductor memory device 100 to the controller. In the embodiment of FIG. 6, data consists of eight bits, hence, there are eight data input/output DQ0 to DQ7 lines. However, the number of data input/output lines is not limited to eight, and 16 or 32 data input/output lines may be provided according to various embodiments.

According to an embodiment, the data input/output lines DQ0 to DQ7 may form a channel for communication between the semiconductor memory device 100 and the controller.

The semiconductor memory device may receive a control signal for setting the input buffer reference voltage for input buffers included therein through the channel.

The control signal may be a combination of a command, an address and data. For example, the semiconductor memory device may receive a reference voltage setting command (command), a reference voltage setting address (address) and a reference voltage generation code (data) as the control signal. According to an embodiment, the reference voltage setting command may correspond to a set feature operation. In addition, the reference voltage setting address may be a feature address for setting a reference voltage according to the set feature operation.

The command latch enable CLE signal may be at a high level when the reference voltage setting command (command) is inputted through the data input/output DQ0 to DQ7 lines. The address latch enable signal ALE may be at a high level when the reference voltage setting address (address) is inputted through the data input/output DQ0 to DQ7 lines.

When the reference voltage generation code (data) is inputted through the data input/output DQ0 to DQ7 lines, the semiconductor memory device may generate a selection signal according to the reference voltage generation code. More specifically, the semiconductor memory device may decode the input reference voltage generation code to generate the selection signal. The semiconductor memory device may determine an internal voltage corresponding to the selection signal among a plurality of internal voltages having different voltage levels. The semiconductor memory device may use the determined internal voltage to the input buffers as the input buffer reference voltage.

According to an embodiment, the semiconductor memory device may receive a reference voltage setting command (command), a LUN address (or die address), a reference voltage setting address (feature address) and a reference voltage generation code (data). The reference voltage setting command may correspond to a LUN set feature operation. The LUN address or the die address may be provided for identifying the semiconductor memory device 100. The reference voltage setting address may be a feature address for setting the input buffer reference voltage according to the LUN set feature operation.

The address latch enable signal ALE may be at a high level when the LUN address and the reference voltage setting address (address) are inputted through the data input/output DQ0 to DQ7 lines.

Figure 7:
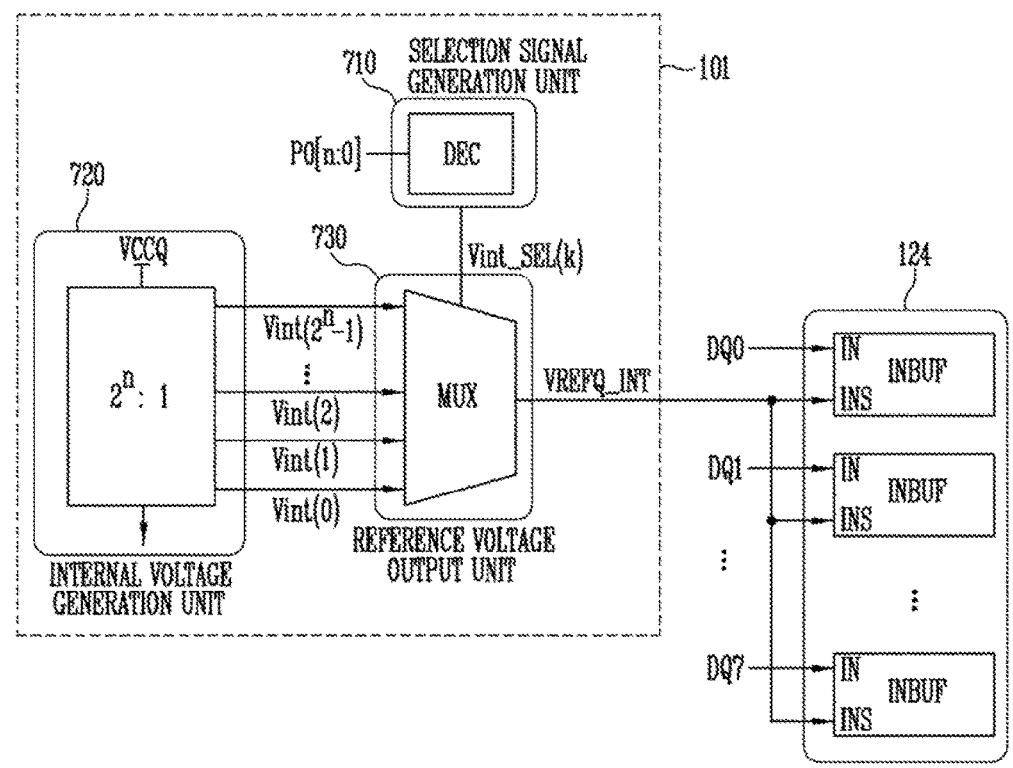
FIG. 7 is a block diagram illustrating an exemplary configuration of an input buffer reference voltage control unit employed in the semiconductor memory device of FIG. 2.

FIG. 7 is a block diagram illustrating an exemplary configuration of the input buffer reference voltage control unit 101 shown in FIG. 2.

Referring to FIG. 7, the input buffer reference voltage control unit 101 may include a selection signal generation unit 710, an internal voltage generation unit 720 and a reference voltage output unit 730.

The input buffer reference voltage control unit 101 may set an internal voltage corresponding to reference voltage generation codes P0[$n$:0] inputted from the external controller (e.g. controller 200 of FIG. 1) as the input buffer reference voltage of the semiconductor memory device 100.

More specifically, the selection signal generation unit 710 may receive the reference voltage generation codes P0[$n$:0] through the data input/output DQ0 to DQ7 lines. The selection signal generation unit 710 may decode the reference voltage generation codes P0[$n$:0] to generate a selection signal Vint_SEL(k). According to an embodiment, the selection signal generation unit 710 may be embodied as a decoder. The selection signal generation unit 710 may transfer the generated selection signal Vint_SEL(k) to the reference voltage output unit 730.

The internal voltage generation unit 720 may receive an input buffer voltage VCCQ from the outside of the semiconductor memory device. The internal voltage generation unit 720 may then generate a plurality of internal voltages Vint(0), Vint(1), Vint(2) to Vint($2^n$−1) having different voltage levels from the input buffer voltage VCCQ. According to an embodiment, the internal voltage generation unit 720 may generate a plurality of internal voltages Vint(0) to Vint($2^n$−1) having different voltage levels using a voltage division method. The internal voltage generation unit 720 may transfer the generated internal voltages Vint(0), Vint(1), Vint(2) to Vint($2^n$−1) to the reference voltage output unit 730.

The reference voltage output unit 730 may output one of the internal voltages Vint(0), Vint(1), Vint(2) to Vint($2^n$−1) received from the internal voltage generation unit 720 as an input buffer reference voltage VREFQ_INT in response to the selection signal Vint_SEL(k) received from the selection signal generation unit 710. For example, the selection signal Vint_SEL(k) may correspond to one of the plurality of internal voltages Vint(0), Vint(1), Vint(2) to Vint($2^n$−1) which have different voltage levels.

According to an embodiment, the input buffers may be differential input buffers driven by the differences between the input buffer reference voltage and data inputted through the data input/output DQ0 to DQ7 lines. The input buffer reference voltage VREFQ_INT output by the reference voltage output unit 730 may serve as the reference voltage of the input buffers. However, when new reference voltage generation codes P0[$n$:0] are inputted through the selection signal generation unit 710, the input buffer reference voltage VREFQ_INT may be changed into one of the plurality of internal voltages Vint(0) to Vint($2^n$−1) having different voltage levels.

Figure 8:
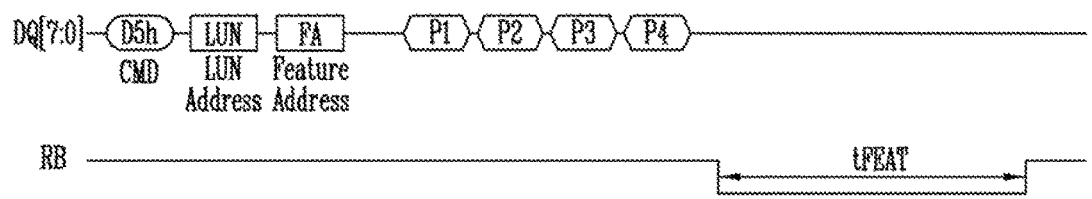
FIG. 8 is a diagram illustrating a method of controlling an input buffer reference voltage according to an embodiment.

FIG. 8 is a diagram illustrating a method of controlling the input buffer reference voltage according to an embodiment.

FIG. 8 illustrates signals of the data input/output DQ0 to DQ7 lines and the ready busy RB line when the input buffer reference voltage is set.

The semiconductor memory device 100 may receive a command CMD, a LUN address, a feature address FA and reference voltage generation codes P1, P2, P3, and P4 through the data input/output DQ0 to DQ7 lines. Though not shown in FIG. 8, when the command CMD is inputted through the data input/output DQ0 to DQ7 lines, the command latch enable signal CLE may be at a high level. When the LUN address and the feature address FA are input through the data input/output DQ0 to DQ7 lines, the address latch enable signal ALE may be at a high level.

The command CMD may be to set the input buffer reference voltage. The LUN address may be to identify a semiconductor memory device corresponding to the command CMD. The feature address FA may be to set the input buffer reference voltage.

When the command CMD, the LUN address, the feature address and the reference voltage generation codes P1, P2, P3, and P4 are inputted through the data input/output DQ0 to DQ7 lines, the input buffer reference voltage control unit 101 of the semiconductor memory device 100 may set the input buffer reference voltage by the method described with reference to the embodiment shown in FIG. 7. Since the semiconductor memory device performs an internal operation, i.e., an operation of setting the input buffer reference voltage while setting reference voltages, the ready busy RB line may be in a low enable state during a time segment (denoted as "tFEAT" in FIG. 8) of the setting of the reference voltages.

After the operation of setting the input buffer reference voltage is performed, i.e., after the time segment tFEAT, the semiconductor memory device may perform an operation using the set input buffer reference voltage.

The input buffer reference voltage setting operation described according to the embodiment shown in FIG. 8 may be performed after the semiconductor memory device is powered up.

Subsequently, when a new command CMD, a new LUN address, a new feature address, and new reference voltage generation codes P1, P2, P3, and P4 are input to change the input buffer reference voltage, the semiconductor memory device may set a new input buffer reference voltage in response to the received reference voltage generation codes.

Figure 9:
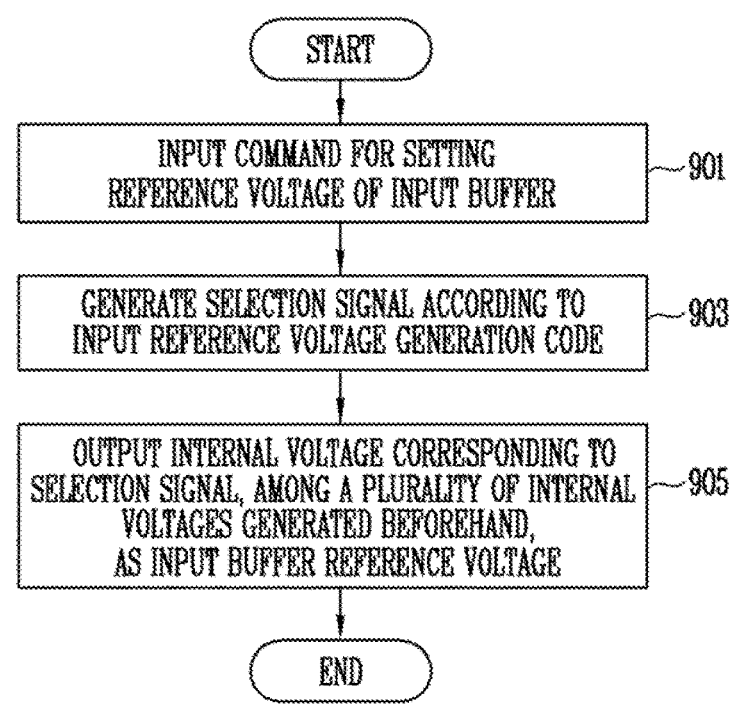
FIG. 9 is a flowchart illustrating a method of operating a semiconductor memory device according to an embodiment.

FIG. 9 is a flowchart illustrating a method of operating a semiconductor memory device according to an embodiment.

Referring to FIG. 9, the semiconductor memory device may receive a command for setting an input buffer reference voltage at step 901. Though not shown in FIG. 9, the semiconductor memory device may receive a feature address and a reference voltage generation code, along with the command for setting the input buffer reference voltage. According to an embodiment, the semiconductor memory device may further receive a LUN address.

At step 903, the semiconductor memory device may generate a selection signal according to the input reference voltage generation code. For example, the semiconductor memory device may decode the reference voltage generation code input through the data input/output DQ0 to DQ7 lines to generate the selection signal.

At step 905, the semiconductor memory device may determine as the input buffer reference voltage an internal voltage corresponding to the selection signal among a plurality of internal voltages.

Figure 10:
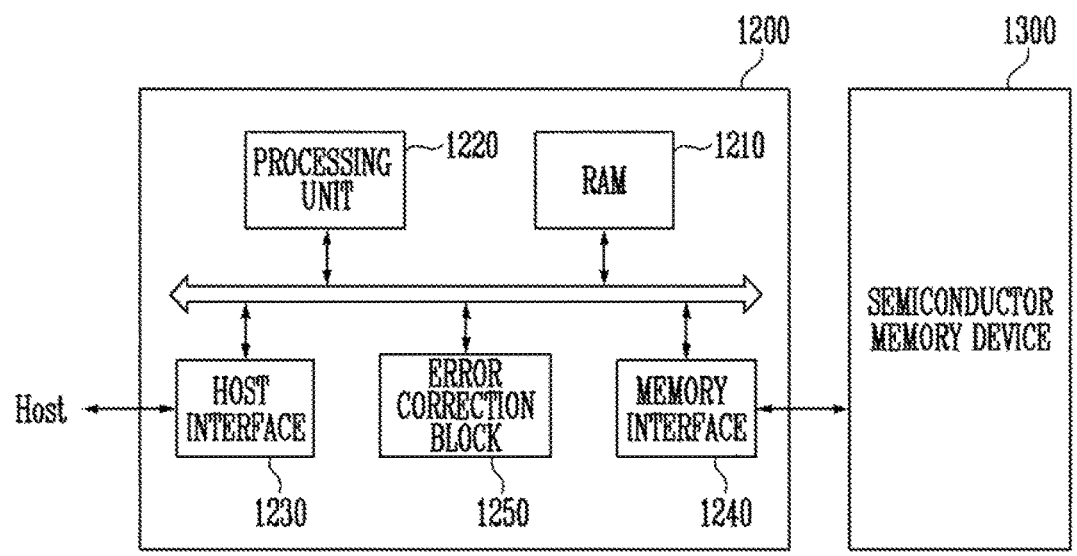
FIG. 10 is a block diagram illustrating a memory system including a semiconductor memory device shown in FIG. 2.

FIG. 10 is a block diagram illustrating a memory system 1000 including the semiconductor memory device shown in FIG. 2.

Referring to FIG. 10, the memory system 1000 may include a semiconductor memory device 1300 and a controller 1200.

The semiconductor memory device 1300 may be configured and operated in substantially the same manner as the semiconductor memory device 100 described above with reference to FIG. 2. Thus, a detailed description thereof will be omitted.

The controller 1200 may be coupled to a host and the semiconductor memory device 1300. The controller 1200 may access the semiconductor memory device 1300 at the request of the host. For example, the controller 1200 may control a read operation, a program operation, an erase operation, and/or a background operation of the semiconductor memory device 1300. The controller 1200 may provide an interface between the semiconductor memory device 1300 and the host. The controller 1200 may drive firmware for controlling the semiconductor memory device 1300.

The controller 1200 may include a random access memory (RAM) 1210, a processing unit 1220, a host interface 1230, a memory interface 1240 and an error correction block 1250 operatively coupled via an internal bus.

The RAM 1210 may be used as operation memory of the processing unit 1220, a cache memory between the semiconductor memory device 1300 and the host, and/or a buffer memory between the semiconductor memory device 1300 and the host.

The processing unit 1220 may control operations of the controller 1200. The processing unit may be configured to control a read operation, a program operation, an erase operation and background operations of the semiconductor memory device 1000. The processing unit 1220 may be configured to operate firmware to control the semiconductor memory device 1000. According to an embodiment, the processing unit 1220 may function as a flash translation layer FTL. The processing unit 1220 may translate a logical block address LBA provided by the host into a physical block address PBA through the flash translation layer FTL. The flash translation layer FTL may receive the logical block address LBA by using a mapping table and translate the logical block address LBA into the physical block address PBA. Various address mapping methods may be used for the flash translation layer according to a mapping unit. Examples of these address mapping methods may include a page mapping method, a block mapping method, and a hybrid mapping method.

The processing unit 1220 may be configured to randomize data received from the host. For example, the processing unit 1220 may randomize the data received from the host by using a randomizing seed. The randomized data may be provided to the semiconductor memory device 1300, so that the memory cell array may be programmed with the randomized data.

The processing unit 1220 may be configured to derandomize the data from the semiconductor memory device 1300 during a read operation. For example, the processing unit 1220 may derandomize the data received from the semiconductor memory device 1000 by using a derandomizing seed. The derandomized data may be output to the host.

According to an embodiment, the processing unit 1220 may perform randomizing and derandomizing operations by driving software or firmware.

The host interface 1230 may include a protocol for data exchange between the host and the controller 1200. According to an embodiment, the controller 1200 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1240 may interface with the semiconductor memory device 1300. For example, the memory interface may include a NAND flash interface or a NOR flash interface.

The error correction code circuit 1250 may, for example, generate parity which is an error correction code (ECC) for data to program. In addition, during a read operation, the error correction code circuit 1250 may correct an error in the read page data by using the parity. The error correction code circuit 1250 may correct an error by using a coded modulation, such as low density parity check (LDPC) code, Bose-Chaudhuri-Hocquenghem code (BCH) code, turbo code, Reed-Solomon code, convolution code, recursive systematic code (RSC), trellis-coded modulation (TCM), block coded modulation (BCM), and hamming code.

During the read operation, the error correction code circuit 1250 may correct an error in the read page data. When the read page data include error bits exceeding the number of correctable bit errors, decoding may fall. When the page data include error bits less than or equal to the number of correctable error bits, decoding may succeed. Decoding success may indicate that the corresponding read command passes. Decoding failure may indicate that the corresponding read command fails. When decoding succeeds, the controller 1200 may output the error-corrected page data to the host.

The controller 1200 and the semiconductor memory device 1300 may be integrated in one semiconductor device. According to an embodiment, the controller 1200 and the semiconductor memory device 1300 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMC micro), an SD card (SD, miniSD, micro SD or SDHC), a universal flash storage device (UFS), etc.

The controller 1200 and the semiconductor memory device 1300 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra-mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 1300 or the memory system 1000 may be packaged in various forms. For example, the semiconductor memory device 1300 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), etc.

Figure 11:
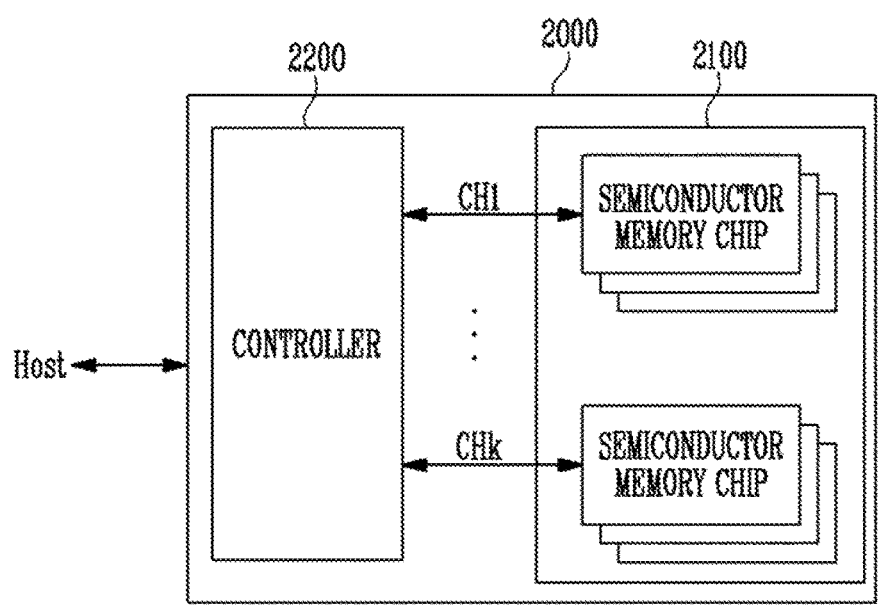
FIG. 11 is a block diagram illustrating an application example of a memory system shown in FIG. 10.

FIG. 11 is a block diagram illustrating an application example (2000) of the memory system 1000 shown in FIG. 10.

Referring to FIG. 11, a memory system 2000 may include a semiconductor memory device 2100 and a controller 2200. The semiconductor memory device 2100 may include semiconductor memory chips. The semiconductor memory chips may be divided into groups.

FIG. 11 illustrates the semiconductor memory chip groups communicating with the controller 2200 through first to k-th channels CH1 to CHk. Each of the semiconductor memory chips may be configured and operated in substantially the same manner as the semiconductor memory device 1000 described above with reference to FIG. 10.

Each semiconductor memory chip group may communicate with the controller 2200 through a single common channel. The controller 2200 may be configured in substantially the same manner as the controller 1200 described with reference to FIG. 10, and configured to control the plurality of memory chips of the semiconductor memory device 2100.

As illustrated in FIG. 11, a plurality of semiconductor memory chips may be coupled to a single channel. However, the memory system 2000 may be modified so that a single semiconductor memory chip may be coupled to a single channel.

Figure 12:
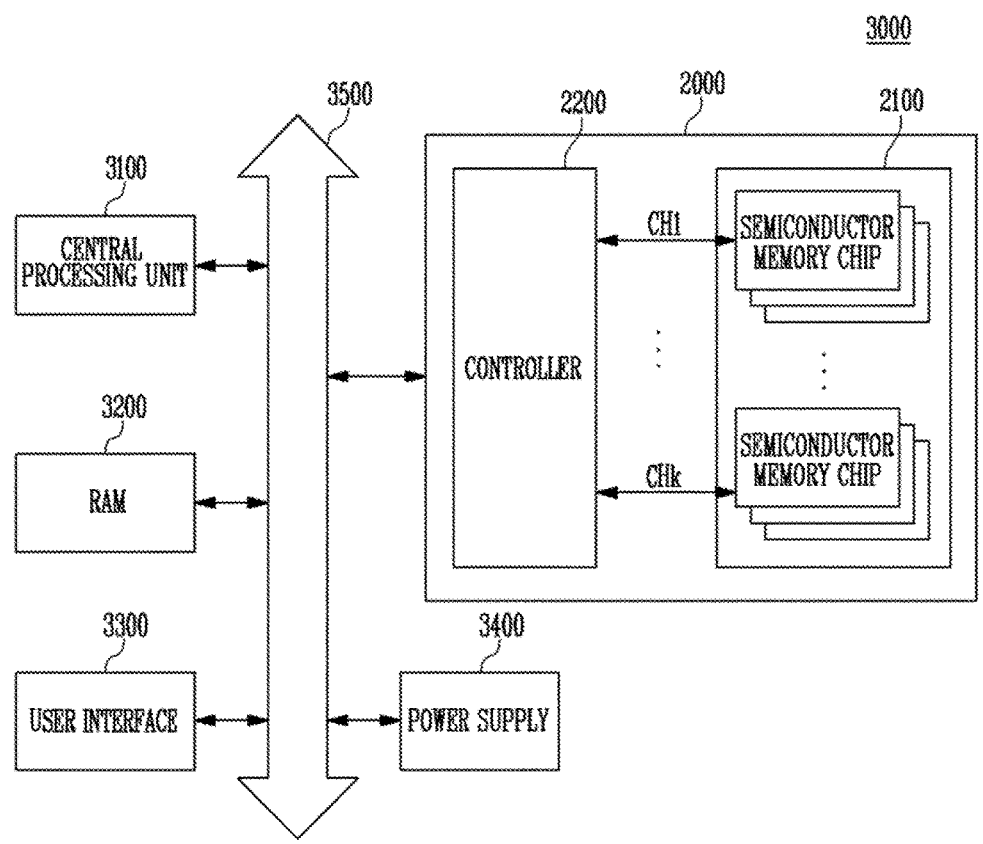
FIG. 12 is a block diagram illustrating a computing system including a memory system described with reference to FIG. 11.

FIG. 12 is a block diagram illustrating a computing system 3000 including the memory system 2000 described above with reference to FIG. 11.

Referring to FIG. 12, the computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 12, the semiconductor memory device 2100 may be coupled to the system bus 3500 through the controller 2200. However, the semiconductor memory device 2100 may be directly coupled to the system bus 3500 in which case the central processing unit 3100 and the RAM 3200 may perform the functions of the controller 2200.

As illustrated in FIG. 12, the memory system 2000 shown in FIG. 11 may be provided as the memory system 3000. However, in another embodiment, the memory system 2000 may be replaced with the memory system 1000 shown in FIG. 10. According to yet another embodiment, the computing system 3000 may include both of the memory systems 1000 and 2000 described above with reference to FIGS. 10 and 11.

According to an embodiment, unlike the conventional method by which a reference voltage (e.g., 0.5*VCCQ) having a fixed level is received from an external device, a semiconductor memory device may generate internal voltages having various levels, and one of the internal voltages may be selected according to a reference voltage generation code received from a controller, so that an optimal reference voltage at which an input buffer operates may be set. According to an embodiment, individual optimal reference voltages may be provided to the respective semiconductor memory devices stacked in a semiconductor memory package. According to an embodiment, an operating margin of an input buffer in the next-generation memory chip requiring a low-voltage, high-speed operation, operations of a high-capacity package may be facilitated, and the number of external input pins may be reduced since a separate reference voltage having a fixed level may not be inputted.

According to an embodiment, a semiconductor memory device using an optimal reference voltage for an input buffer and an operating method thereof may be provided.

While the present disclosure has been described with reference to specific embodiments, it will be understood by those of ordinary skill in the art that various changes in form and details may be made therein without departing from the spirit and scope of the invention of the present disclosure as defined by the following claims.

In the above-described of embodiments, features or steps described herein may be omitted, additional steps or features may be included, and/or features or steps described herein may be combined in a manner different from the specific combinations recited herein without departing from the spirit of the application, all as understood by those of skill in the art.

Although the examples of embodiments of the present disclosure have been illustrated and the accompanying drawings and specific terms have been used, they are used in a general meaning in order to assist in the understanding the present disclosure and do not limit the scope of the present disclosure. It will be obvious to those skilled in the art to which the present disclosure pertains that other modifications based on the spirit of the present disclosure may be made in addition to the above-mentioned examples of embodiments.

What is claimed is:

1. A semiconductor memory device including a plurality of memory cells, the semiconductor memory device comprising:
   at least one input buffer receiving data to be stored in the plurality of memory cells; and
   an input buffer reference voltage control unit setting one of a plurality of internal voltages having different voltage levels as a reference voltage of the at least one input buffer in response to a control signal,
   wherein the control signal includes a feature address indicating setting of the reference voltage, and a reference voltage generation code corresponding to one of the internal voltages,
   wherein the input buffer reference voltage control unit comprises:
   an internal voltage generation unit generating the plurality of internal voltages;
   a selection signal generation unit generating a selection signal to select one of the plurality of internal voltages according to the reference voltage generation code; and
   a reference voltage output unit providing one of the internal voltages to the at least one input buffer in response to the selection signal, and
   wherein the selection signal generation unit generates the selection signal by decoding the reference voltage generation code.

2. The semiconductor memory device of claim 1, wherein the control signal further includes a command and a logical unit number (LUN) address for identifying the semiconductor memory device.

3. The semiconductor memory device of claim 1, wherein the internal voltage generation unit generates the plurality of internal voltages by dividing an external voltage.

4. The semiconductor memory device of claim 1, wherein the at least one input buffer is a differential input buffer driven by difference between the reference voltage and externally input data.

5. A method of operating a semiconductor memory device including at least one input buffer receiving data from an external device, the method comprising:
   receiving a control signal for setting a reference voltage of the at least one input buffer; and
   setting one of a plurality of internal voltages having different voltage levels as the reference voltage in response to the control signal,
   wherein the control signal includes a feature address indicating setting of the reference voltage, and a reference voltage generation code corresponding to one of the internal voltages,
   wherein the setting of the reference voltage comprises:
   generating the plurality of internal voltages;
   generating a selection signal to select one of the internal voltages according to the reference voltage generation code; and
   providing one of the internal voltages to the at least one input buffer in response to the selection signal, and
   wherein the generating of the selection signal comprises generating the selection signal by decoding the reference voltage generation code.

6. The method of claim 5, wherein the control signal includes a command and a logical unit number (LUN) address for identifying the semiconductor memory device.

7. The method of claim 5, wherein the generating of the plurality of internal voltages comprises generating the plurality of internal voltages by dividing an external voltage.

8. The method of claim 5, wherein the at least one input buffer is a differential input buffer driven by difference between the reference voltage and the data received from the external device.

9. A memory system, comprising:
   a plurality of semiconductor memory devices each including at least one input buffer receiving data from an external device; and
   a controller providing the plurality of semiconductor memory devices with control signals for setting an optimal reference voltage of the at least one input buffer corresponding to each of the plurality of semiconductor memory devices,
   wherein each of the control signals includes a feature address indicating setting of the optimal reference voltage of a corresponding one among the plurality of semiconductor memory device, and a reference voltage generation code indicating the optimal reference voltage of the corresponding semiconductor memory device,
   wherein each of the plurality of semiconductor memory devices includes an input buffer reference voltage control unit setting one of a plurality of internal voltages having different voltage levels as the optimal reference voltage of the corresponding semiconductor memory device in response to a corresponding one among the control signals, wherein the input buffer reference voltage control unit comprises:

an internal voltage generation unit generating the internal voltages;

a selection signal generation unit generating a selection signal to select one of the internal voltages according to the reference voltage generation code; and a reference voltage output unit providing one of the internal voltages to the at least one input buffer in response to the selection signal, and wherein the selection signal generation unit generates the selection signal by decoding the reference voltage generation code.

10. The memory system of claim 9, wherein each of the control signals includes a command and a logical unit number (LUN) address for identifying the plurality of semiconductor memory devices.

11. The memory system of claim 9, wherein each of the plurality of semiconductor memory devices includes an input buffer reference voltage control unit setting one of a plurality of internal voltages having different voltage levels as the optimal reference voltage of the corresponding semiconductor memory device in response to a corresponding one among the control signals.

12. The memory system of claim 9, wherein the selection signal generation unit generates the selection signal by decoding the reference voltage generation code.

13. The memory system of claim 9, wherein the at least one input buffer is a differential input buffer driven by difference between the optimal reference voltage and the data received from the external device.

* * * * *